(12) United States Patent
Goodwin (10) Patent No.: US 7,480,152 B2
(45) Date of Patent: *Jan. 20, 2009

(54) THIN MODULE SYSTEM AND METHOD

(75) Inventor: Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 338 days.

This patent is subject to a terminal disclaimer.

(21) Appl. No.: 11/005,992

(22) Filed: Dec. 7, 2004

(65) Prior Publication Data

US 2006/0050496 A1    Mar. 9, 2006

Related U.S. Application Data

(63) Continuation-in-part of application No. 10/934,027, filed on Sep. 3, 2004.

(51) Int. Cl.
*H05K 1/11* (2006.01)
(52) U.S. Cl. .................. 361/803; 361/789; 361/790; 174/254; 174/268; 257/724; 257/726; 257/738; 257/777
(58) Field of Classification Search .......... 174/254, 174/268; 257/E23.065–E23.067, 723, 724, 257/726, 737, 738, 686, 777; 361/789, 790, 361/803; 365/51, 233
See application file for complete search history.

(56) References Cited

U.S. PATENT DOCUMENTS

| | | |
|---|---|---|
| 3,372,310 A | 3/1968 | Kantor |
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |

(Continued)

FOREIGN PATENT DOCUMENTS

EP    122-687 (A)    10/1984

(Continued)

OTHER PUBLICATIONS

Pages 19-22 of Presentation by Netlist, Aug. 2004.

(Continued)

*Primary Examiner*—Dean A. Reichard
*Assistant Examiner*—Xiaoliang Chen
(74) *Attorney, Agent, or Firm*—Fish & Richardson P.C.

(57) ABSTRACT

A flexible circuit is populated with integrated circuits. Integrated circuits populated on the side of the flexible circuit closest to the substrate are disposed, at least partially, in what are, in a preferred embodiment, windows, pockets, or cutaway areas in the substrate. In a preferred embodiment, the overall module profile does not, consequently, include the thickness of the substrate. Other embodiments may only populate one side of the flexible circuit or may only remove enough substrate material to reduce but not eliminate the entire substrate contribution to overall profile. The flex circuit may be aligned using tooling holes in the flex circuit and substrate. The flexible circuit may exhibit one or two or more conductive layers, and may have changes in the layered structure or have split layers. Other embodiments may stagger or offset the ICs.

7 Claims, 11 Drawing Sheets

U.S. PATENT DOCUMENTS

| | | |
|---|---|---|
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, III et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A * | 3/1998 | Clayton .................. 257/723 |
| 5,739,887 A * | 4/1998 | Ueda et al. ............... 349/149 |
| 5,744,862 A | 4/1998 | Ishii |
| 5,751,553 A * | 5/1998 | Clayton .................. 361/749 |
| 5,754,409 A * | 5/1998 | Smith .................... 361/803 |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A * | 4/2000 | Clayton .................... 29/832 |
| 6,060,339 A | 5/2000 | Akram et al. |
| 6,072,233 A | 6/2000 | Corisis et al. |
| 6,078,515 A | 6/2000 | Nielsen et al. |

| | | | | | | |
|---|---|---|---|---|---|---|
| 6,084,294 | A | 7/2000 | Tomita | 6,566,746 | B2 | 5/2003 | Isaak et al. |
| 6,091,145 | A * | 7/2000 | Clayton ............ 257/724 | 6,572,387 | B2 | 6/2003 | Burns et al. |
| 6,097,087 | A | 8/2000 | Farnworth et al. | 6,573,593 | B1 | 6/2003 | Syri et al. |
| 6,111,757 | A | 8/2000 | Dell et al. | 6,576,992 | B1 * | 6/2003 | Cady et al. ............ 257/686 |
| 6,121,676 | A | 9/2000 | Solberg | 6,588,095 | B2 | 7/2003 | Pan |
| RE36,916 | E | 10/2000 | Moshayedi | 6,590,282 | B1 | 7/2003 | Wang et al. |
| 6,157,541 | A | 12/2000 | Hacke | 6,600,222 | B1 | 7/2003 | Levardo |
| 6,172,874 | B1 | 1/2001 | Bartilson | 6,614,664 | B2 | 9/2003 | Lee |
| 6,178,093 | B1 | 1/2001 | Bhatt et al. | 6,627,984 | B2 | 9/2003 | Bruce et al. |
| 6,180,881 | B1 * | 1/2001 | Isaak ............ 174/524 | 6,629,855 | B1 | 10/2003 | North et al. |
| 6,187,652 | B1 | 2/2001 | Chou et al. | 6,646,936 | B2 | 11/2003 | Hamamatsu et al. |
| 6,205,654 | B1 | 3/2001 | Burns | 6,660,561 | B2 | 12/2003 | Forthun |
| 6,208,521 | B1 | 3/2001 | Nakatsuka | 6,661,092 | B2 | 12/2003 | Shibata et al. |
| 6,208,546 | B1 | 3/2001 | Ikeda | 6,677,670 | B2 | 1/2004 | Kondo |
| 6,214,641 | B1 | 4/2001 | Akram | 6,683,377 | B1 | 1/2004 | Shim et al. |
| 6,215,181 | B1 | 4/2001 | Akram et al. | 6,690,584 | B2 | 2/2004 | Uzuka et al. |
| 6,215,687 | B1 | 4/2001 | Sugano et al. | 6,699,730 | B2 | 3/2004 | Kim et al. |
| 6,222,737 | B1 | 4/2001 | Ross | 6,720,652 | B2 | 4/2004 | Akram et al. |
| 6,222,739 | B1 | 4/2001 | Bhakta et al. | 6,721,181 | B1 | 4/2004 | Pfeifer et al. |
| 6,225,688 | B1 | 5/2001 | Kim et al. | 6,721,185 | B2 | 4/2004 | Dong et al. |
| 6,232,659 | B1 * | 5/2001 | Clayton ............ 257/724 | 6,721,226 | B2 | 4/2004 | Woo et al. |
| 6,233,650 | B1 | 5/2001 | Johnson et al. | 6,744,656 | B2 | 6/2004 | Sugano et al. |
| 6,234,820 | B1 | 5/2001 | Perino et al. | 6,751,113 | B2 | 6/2004 | Bhakta et al. |
| 6,262,476 | B1 | 7/2001 | Vidal | 6,756,661 | B2 | 6/2004 | Tsuneda et al. |
| 6,262,895 | B1 | 7/2001 | Forthun | 6,760,220 | B2 | 7/2004 | Canter et al. |
| 6,265,660 | B1 | 7/2001 | Tandy | 6,762,942 | B1 | 7/2004 | Smith |
| 6,266,252 | B1 | 7/2001 | Karabatsos | 6,768,660 | B2 | 7/2004 | Kong et al. |
| 6,281,577 | B1 | 8/2001 | Oppermann et al. | 6,833,981 | B2 | 12/2004 | Suwabe et al. |
| 6,288,907 | B1 | 9/2001 | Burns | 6,833,984 | B1 | 12/2004 | Belgacem |
| 6,288,924 | B1 | 9/2001 | Sugano et al. | 6,839,266 | B2 | 1/2005 | Garrett, Jr. et al. |
| 6,300,679 | B1 | 10/2001 | Mukerji et al. | 6,841,868 | B2 | 1/2005 | Akram et al. |
| 6,316,825 | B1 | 11/2001 | Park et al. | 6,850,414 | B2 | 2/2005 | Benisek et al. |
| 6,323,060 | B1 | 11/2001 | Isaak | 6,873,534 | B2 | 3/2005 | Bhakta et al. |
| 6,336,262 | B1 | 1/2002 | Dalal et al. | 6,878,571 | B2 | 4/2005 | Isaak et al. |
| 6,343,020 | B1 | 1/2002 | Lin et al. | 6,884,653 | B2 | 4/2005 | Larson |
| 6,347,394 | B1 | 2/2002 | Ochoa et al. | 6,914,324 | B2 | 7/2005 | Rapport et al. |
| 6,349,050 | B1 | 2/2002 | Woo et al. | 6,919,626 | B2 | 7/2005 | Burns |
| 6,351,029 | B1 | 2/2002 | Isaak | 6,956,284 | B2 | 10/2005 | Cady et al. |
| 6,357,023 | B1 | 3/2002 | Co et al. | 7,053,478 | B2 | 5/2006 | Roper et al. |
| 6,358,772 | B2 | 3/2002 | Miyoshi | 7,094,632 | B2 | 8/2006 | Cady et al. |
| 6,360,433 | B1 | 3/2002 | Ross | 7,180,167 | B2 * | 2/2007 | Partridge et al. ............ 257/686 |
| 6,368,896 | B2 | 4/2002 | Farnworth et al. | 7,289,327 | B2 * | 10/2007 | Goodwin et al. ............ 361/701 |
| 6,370,668 | B1 | 4/2002 | Garrett, Jr. et al. | 2001/0001085 | A1 | 5/2001 | Hassanzadeh et al. |
| 6,376,769 | B1 | 4/2002 | Chung | 2001/0006252 | A1 | 7/2001 | Kim et al. |
| 6,392,162 | B1 | 5/2002 | Karabatsos | 2001/0013423 | A1 | 8/2001 | Dalal et al. |
| 6,404,043 | B1 | 6/2002 | Isaak | 2001/0015487 | A1 | 8/2001 | Forthun |
| 6,410,857 | B1 | 6/2002 | Gonya | 2001/0026009 | A1 | 10/2001 | Tsuneda et al. |
| 6,426,240 | B2 | 7/2002 | Isaak | 2001/0028588 | A1 | 10/2001 | Yamada et al. |
| 6,426,549 | B1 | 7/2002 | Isaak | 2001/0035572 | A1 | 11/2001 | Isaak |
| 6,426,560 | B1 | 7/2002 | Kawamura et al. | 2001/0040793 | A1 | 11/2001 | Inaba |
| 6,428,360 | B2 | 8/2002 | Hassanzadeh et al. | 2001/0052637 | A1 | 12/2001 | Akram et al. |
| 6,433,418 | B1 | 8/2002 | Fujisawa et al. | 2002/0001216 | A1 | 1/2002 | Sugano et al. |
| 6,444,921 | B1 | 9/2002 | Wang et al. | 2002/0006032 | A1 | 1/2002 | Karabatsos |
| 6,446,158 | B1 | 9/2002 | Karabatsos | 2002/0030995 | A1 | 3/2002 | Shoji |
| 6,449,159 | B1 * | 9/2002 | Haba ............ 361/707 | 2002/0076919 | A1 | 6/2002 | Peters et al. |
| 6,452,826 | B1 | 9/2002 | Kim et al. | 2002/0094603 | A1 | 7/2002 | Isaak |
| 6,459,152 | B1 | 10/2002 | Tomita et al. | 2002/0101261 | A1 | 8/2002 | Karabatsos |
| 6,462,412 | B2 | 10/2002 | Kamei et al. | 2002/0139577 | A1 | 10/2002 | Miller |
| 6,465,877 | B1 | 10/2002 | Farnworth et al. | 2002/0164838 | A1 | 11/2002 | Moon et al. |
| 6,465,893 | B1 | 10/2002 | Khandros et al. | 2002/0180022 | A1 | 12/2002 | Emoto |
| 6,472,735 | B2 | 10/2002 | Isaak | 2002/0185731 | A1 | 12/2002 | Akram et al. |
| 6,473,308 | B2 | 10/2002 | Forthun | 2002/0196612 | A1 | 12/2002 | Gall et al. |
| 6,486,544 | B1 | 11/2002 | Hashimoto | 2003/0002262 | A1 | 1/2003 | Benisek et al. |
| 6,489,687 | B1 | 12/2002 | Hashimoto | 2003/0026155 | A1 | 2/2003 | Yamagata |
| 6,502,161 | B1 | 12/2002 | Perego et al. | 2003/0035328 | A1 | 2/2003 | Hamamatsu et al. |
| 6,514,793 | B2 | 2/2003 | Isaak | 2003/0045025 | A1 | 3/2003 | Coyle et al. |
| 6,521,984 | B2 | 2/2003 | Matsuura | 2003/0049886 | A1 | 3/2003 | Salmon |
| 6,528,870 | B2 | 3/2003 | Fukatsu et al. | 2003/0064548 | A1 | 4/2003 | Isaak |
| 6,531,772 | B2 | 3/2003 | Akram et al. | 2003/0081387 | A1 | 5/2003 | Schulz |
| 6,544,815 | B2 | 4/2003 | Isaak | 2003/0081392 | A1 | 5/2003 | Cady et al. |
| 6,552,910 | B1 | 4/2003 | Moon et al. | 2003/0089978 | A1 | 5/2003 | Miyamoto et al. |
| 6,552,948 | B2 | 4/2003 | Woo et al. | 2003/0090879 | A1 | 5/2003 | Doblar et al. |
| 6,560,117 | B2 | 5/2003 | Moon | 2003/0096497 | A1 | 5/2003 | Moore et al. |

| | | | |
|---|---|---|---|
| 2003/0109078 A1 | 6/2003 | Takahashi et al. | |
| 2003/0116835 A1* | 6/2003 | Miyamoto et al. | 257/678 |
| 2003/0159278 A1 | 8/2003 | Peddle | |
| 2003/0168725 A1 | 9/2003 | Warner et al. | |
| 2003/0234443 A1* | 12/2003 | Partridge et al. | 257/686 |
| 2004/0000708 A1 | 1/2004 | Rapport et al. | |
| 2004/0012991 A1 | 1/2004 | Kozaru | |
| 2004/0021211 A1 | 2/2004 | Darnberg | |
| 2004/0099938 A1 | 5/2004 | Kang et al. | |
| 2004/0150107 A1 | 8/2004 | Cha et al. | |
| 2004/0229402 A1* | 11/2004 | Cady et al. | 438/109 |
| 2004/0236877 A1* | 11/2004 | Burton | 710/22 |
| 2004/0256731 A1* | 12/2004 | Mao et al. | 257/773 |
| 2004/0262737 A1* | 12/2004 | Haba | 257/692 |
| 2005/0018412 A1* | 1/2005 | Roper et al. | 361/803 |
| 2005/0047776 A1* | 3/2005 | Watanabe et al. | 396/543 |
| 2005/0057911 A1* | 3/2005 | Rapport et al. | 361/803 |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0146031 A1* | 7/2005 | Partridge et al. | 257/738 |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0048385 A1* | 3/2006 | Cady et al. | 29/860 |
| 2006/0049500 A1* | 3/2006 | Goodwin | 257/686 |
| 2006/0049502 A1* | 3/2006 | Goodwin et al. | 257/686 |
| 2006/0049512 A1* | 3/2006 | Goodwin | 257/707 |
| 2006/0049513 A1* | 3/2006 | Goodwin | 257/712 |
| 2006/0050488 A1* | 3/2006 | Goodwin | 361/749 |
| 2006/0050489 A1* | 3/2006 | Wehrly et al. | 361/749 |
| 2006/0050492 A1* | 3/2006 | Goodwin et al. | 361/767 |
| 2006/0050496 A1* | 3/2006 | Goodwin | 361/803 |
| 2006/0050497 A1* | 3/2006 | Goodwin | 361/803 |
| 2006/0050498 A1* | 3/2006 | Cady et al. | 361/803 |
| 2006/0053345 A1* | 3/2006 | Goodwin | 714/42 |
| 2006/0083043 A1* | 4/2006 | Cypher | 365/51 |
| 2006/0090102 A1* | 4/2006 | Wehrly et al. | 714/42 |
| 2006/0091529 A1* | 5/2006 | Wehrly et al. | 257/706 |
| 2006/0095592 A1 | 5/2006 | Borkenhagen | |
| 2006/0111866 A1 | 5/2006 | LeClerg et al. | |
| 2006/0125067 A1* | 6/2006 | Wehrly et al. | 257/679 |
| 2006/0129888 A1* | 6/2006 | Szewerenko et al. | 714/30 |
| 2006/0198238 A1* | 9/2006 | Partridge et al. | 365/233.5 |
| 2006/0203442 A1* | 9/2006 | Goodwin | 361/684 |
| 2006/0250780 A1* | 11/2006 | Goodwin | 361/767 |
| 2006/0261449 A1* | 11/2006 | Rapport et al. | 257/666 |
| 2007/0111606 A1* | 5/2007 | Goodwin | 439/633 |
| 2007/0115017 A1* | 5/2007 | Goodwin et al. | 324/763 |
| 2007/0126124 A1* | 6/2007 | Rapport et al. | 257/777 |
| 2007/0126125 A1* | 6/2007 | Rapport et al. | 257/777 |
| 2007/0176286 A1* | 8/2007 | Wehrly, Jr. | 257/723 |
| 2007/0201208 A1* | 8/2007 | Goodwin et al. | 361/701 |
| 2007/0258217 A1* | 11/2007 | Roper et al. | 361/709 |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
Search Report for GB Application No. GB0516622.8, May 25, 2006.
PCT/US05/28547 International Search Report, PCT, Aug. 18, 2006.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
PCT/US06/06921 International Search Report and Written Opinion, PCT, Jun. 1, 2007.
U.S. Appl. No. 11/306,803, Chris Karabatsos, filed Jan. 11, 2006.

* cited by examiner

THIN MODULE SYSTEM AND METHOD

RELATED APPLICATIONS

This application is a continuation-in-part of U.S. patent application Ser. No. 10/934,027, filed Sep. 3, 2004. U.S. patent application Ser. No. 10/934,027 has been incorporated by reference herein.

FIELD

The present invention relates to systems and methods for creating high density circuit modules.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs provide, however, very limited profile space for such devices and conventional DIMM-based solutions have typically provided only a moderate amount of memory expansion.

There are several known methods to improve the limited capacity of a DIMM or other circuit board. In one strategy, for example, small circuit boards (daughter cards) are connected to the DIMM to provide extra mounting space. The additional connection may cause, however, flawed signal integrity for the data signals passing from the DIMM to the daughter card and the additional thickness of the daughter card(s) increases the profile of the DIMM.

Multiple die packages (MDP) are also used to increase DIMM capacity while preserving profile conformity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another strategy used to increase circuit board capacity. This scheme increases capacity by stacking packaged integrated circuits to create a high-density circuit module for mounting on the circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may alter, however, system requirements such as, for example, required cooling airflow or the minimum spacing around a circuit board on its host system.

What is needed, therefore, are methods and structures for providing high capacity circuit boards in thermally efficient, reliable designs that perform well at higher frequencies but still approach profile minimums.

SUMMARY

A flexible circuit is populated with integrated circuits. Integrated circuits populated on the side of the flexible circuit closest to the substrate are disposed, at least partially, in what are, in a preferred embodiment, windows, pockets, or cut-away areas in the substrate. In a preferred embodiment, the overall module profile does not, consequently, include the thickness of the substrate. Other embodiments may only populate one side of the flexible circuit or may only remove enough substrate material to reduce but not eliminate the entire substrate contribution to overall profile. The flex circuit may be aligned using tooling holes in the flex circuit and substrate. The flexible circuit may exhibit one or two or more conductive layers, and may have changes in the layered structure or have split layers. Other embodiments may stagger or offset the ICs.

DETAILED DESCRIPTION OF PREFERRED EMBODIMENTS

Figure 1:
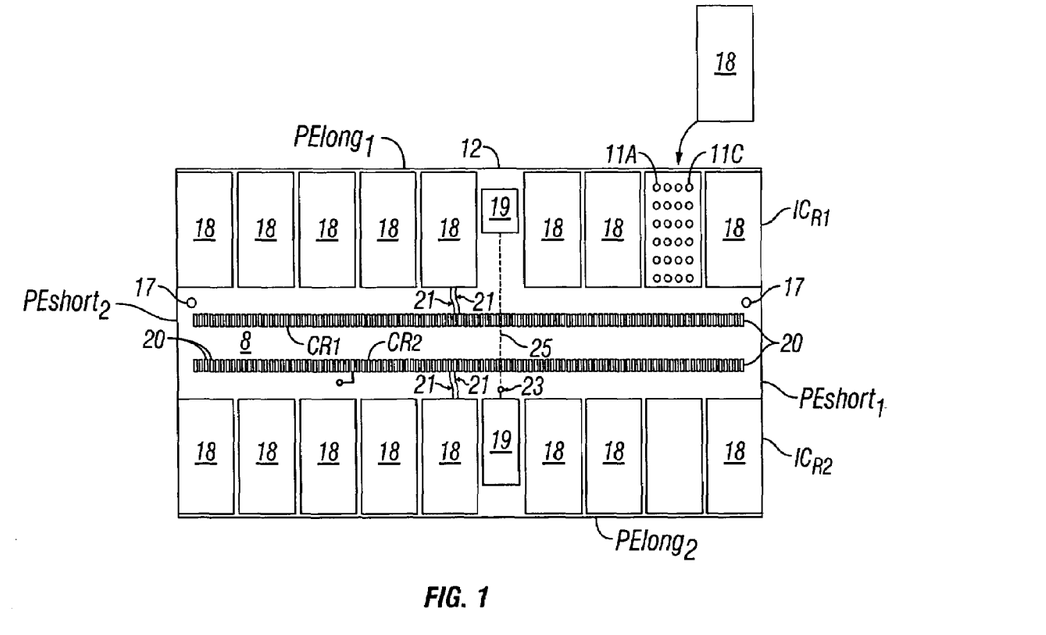
FIG. 1 depicts a contact-bearing first side of a flex circuit devised in accordance with a preferred embodiment of the present invention.
Figure 2:
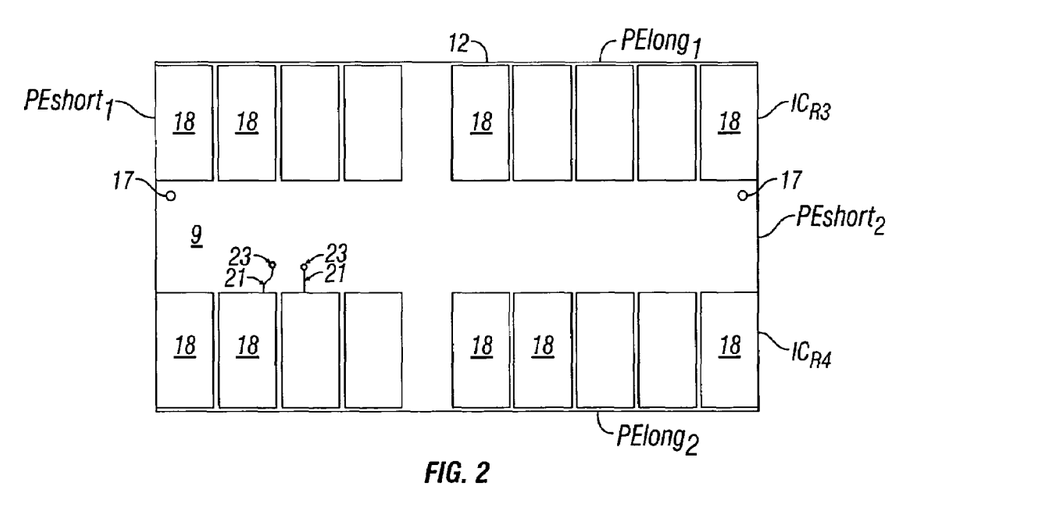
FIG. 2 depicts the second side of the flex circuit of FIG. 1.

FIGS. 1 and 2 depict opposing sides 8 and 9, respectively, of a preferred flex circuit 12 ("flex", "flex circuitry", "flexible circuit") used in constructing a module according to an embodiment of the present invention. Flex circuit 12 is preferably made from one or more conductive layers supported by one or more flexible substrate layers as further described with reference to later Figs. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board or module capability. Circuit 19 depicted between ICs 18 may be a memory buffer or controller.

The depiction of FIG. 1 shows two pluralities of ICs 18 along side 8 of flex circuit 12, the pluralities or sets of ICs being referenced in FIG. 1 as $IC_{R1}$ and $IC_{R2}$. Contact arrays are disposed beneath ICs 18 and circuits 19 to provide conductive pads for interconnection to the ICs 18. An exemplar contact array 11A is shown as is exemplar IC 18 to be mounted at contact array 11A as depicted. The contact arrays 11A that correspond to an IC row (e.g., $IC_{R1}$) may be considered a contact array set. Between the rows $IC_{R1}$ and $IC_{R2}$ of ICs 18, flex circuit 12 has two rows ($C_{R1}$ and $C_{R2}$) of module contacts 20. When flex circuit 12 is folded as depicted in later FIGS. 3 and 4, side 8 depicted in FIG. 1 is presented at the outside of module 10. The opposing side 9 of flex circuit 12 (FIG. 2) is on the inside in the configurations of FIGS. 3 and 4. Other embodiments may have other numbers of rows and there may be only one such row.

FIG. 2 depicts another two pluralities of ICs 18 along side 9 of flex circuit 12 referenced as $IC_{R3}$ and $IC_{R4}$. Various discrete components such as termination resistors, bypass capacitors, and bias resistors may also be mounted on each of sides 8 and 9 of flex 12. Such discrete components are not shown to simplify the drawing. Flex circuit 12 may also depicted with reference to its perimeter edges, two of which are typically long ($PE_{long1}$ and $PE_{long2}$) and two of which are typically shorter ($PE_{short1}$ and $PE_{short2}$) Other embodiments may employ flex circuits 12 that are not rectangular in shape and may be square in which case the perimeter edges would be of equal size or other convenient shape to adapt to manufacturing particulars. However, rectangular shapes for flex circuit 12 assist in providing a low profile for a preferred module devised with use of flex circuit 12.

FIG. 1 depicts exemplar conductive traces 21 connecting rows $C_{R1}$ and $C_{R2}$ of module contacts 20 to ICs 18. Only a few exemplar traces are shown to simplify the drawing. Traces 21 may also connect to vias that may transit to other conductive layers of flex 12 in certain embodiments having more than one conductive layer. Shown is a via 23 connecting a signal trace from circuit 19 to a trace 25 disposed on another conductive layer of flex 12 as illustrated by the dotted line of trace 25. In a preferred embodiment, vias connect ICs 18 on side 9 of flex 12 (FIG. 2) to module contacts 20. Traces 21 and 25 may make other connections between the ICs on either side of flex 12 and may traverse the rows of module contacts 20 to interconnect ICs. Together the various traces and vias make interconnections needed to convey data and control signals to the various ICs. Those of skill will understand that the present invention may be implemented with only a single row of module contacts 20 and may, in other embodiments be implemented as a module bearing ICs on only one side of flex circuit 12 or with fewer or greater numbers of ICs 18 or rows of ICs 18.

Figure 3:
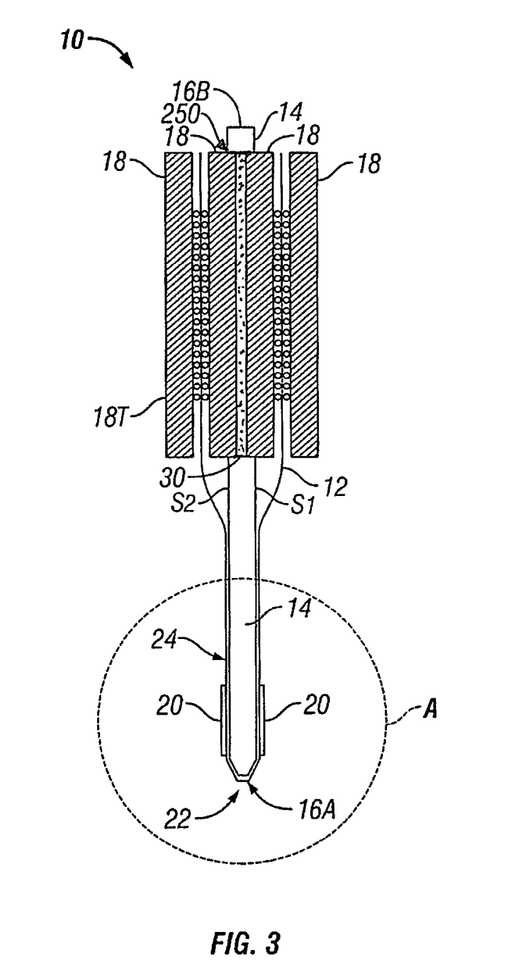
FIG. 3 depicts a cross-sectional view of a module assembly devised in accordance with a preferred embodiment of the present invention.

FIG. 3 is a cross section view of a module 10 devised in accordance with a preferred embodiment of the present invention. Module 10 is populated with ICs 18 having top surfaces $18_T$ and bottom surfaces $18_B$. Substrate 14 or support structure has first and second perimeter edges 16A and 16B appearing in the depiction of FIG. 3 as ends. Substrate or support structure 14 typically has first and second lateral sides $S_1$ and $S_2$. Flex 12 is wrapped about perimeter edge 16A of substrate 14, which in the depicted embodiment, provides the basic shape of a common DIMM board form factor such as that defined by JEDEC standard MO-256. Those of skill will recognize that transitting flex circuit 12 about support structure or substrate 14 as depicted separates a first set of CSPs from a second set of CSPs based upon which lateral side of substrate 14 with which the CSPs are then associated.

The inner pair of the four depicted ICs 18 pass through windows 250 in substrate 14 as shown in later Figs. in further detail and the inner ICs 18 are preferably attached to each other's upper surfaces $18_T$ with a thermally conductive adhesive 30. While in this embodiment, the four depicted ICs are attached to flex circuit 12 in opposing pairs, fewer or greater numbers of ICs may be connected in other arrangements such as, for example, staggered or offset arrangements they may exhibit preferred thermal characteristics. Further, while only CSP packaged ICs are shown, other ICs and components may be employed such as leaded devices. In a preferred embodiment, ICs 18 will be memory CSPs and various discrete components such as, for example, resistors and capacitors will also be mounted on flex circuit 12. To simplify the drawing, the discrete components are not shown.

In this embodiment, flex circuit 12 has module contacts 20 positioned in a manner devised to fit in a circuit board card edge connector or socket and connect to corresponding contacts in the connector (not shown). While module contacts 20 are shown protruding from the surface of flex circuit 12, other embodiments may have flush contacts or contacts below the surface level of flex 12. Substrate 14 supports module contacts 20 from behind flex circuit 12 in a manner devised to provide the mechanical form required for insertion into a socket. In other embodiments, the thickness or shape of substrate 14 in the vicinity of perimeter edge 16A may differ from that in the vicinity of perimeter edge 16B. Substrate 14 in the depicted embodiment is preferably made of a metal such as aluminum or copper, as non-limiting examples, or where thermal management is less of an issue, materials such as FR4 (flame retardant type 4) epoxy laminate, PTFE (poly-tetra-fluoro-ethylene) or plastic. In another embodiment, advantageous features from multiple technologies may be combined with use of FR4 having a layer of copper on both sides to provide a substrate 14 devised from familiar materials which may provide heat conduction or a ground plane.

Figure 4:
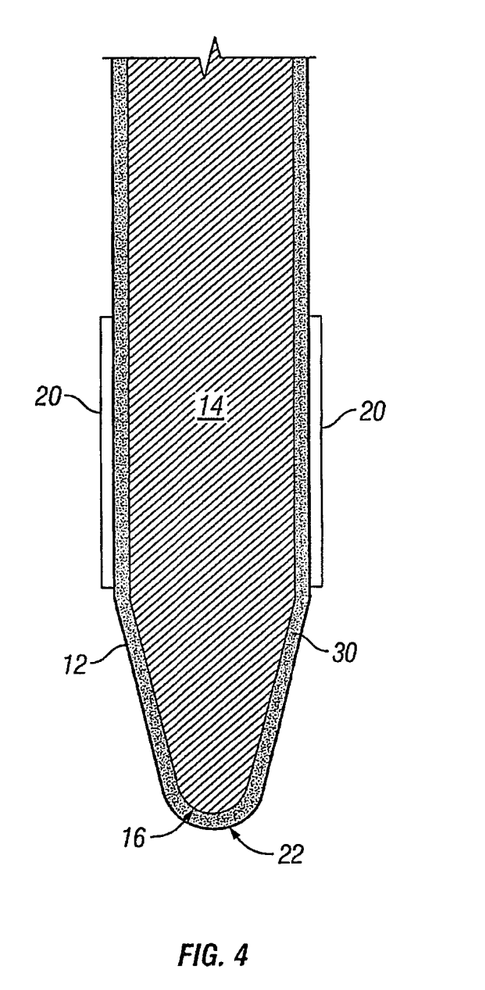
FIG. 4 is an enlarged view of the area marked "A" in FIG. 3.

FIG. 4 is an enlarged view of the area marked 'A' in FIG. 3. Edge 16A of substrate 14 is shaped like a male side edge of an edge card connector. While a particular oval-like configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In some other embodiments, flex circuit 12 may be wrapped about perimeter edge 16B or both perimeter edges 16A and 16B of substrate 14. In other instances, multiple flex circuits may be employed or a single flex circuit may connect one or both sets of contacts 20 to the resident ICs.

Figure 5:
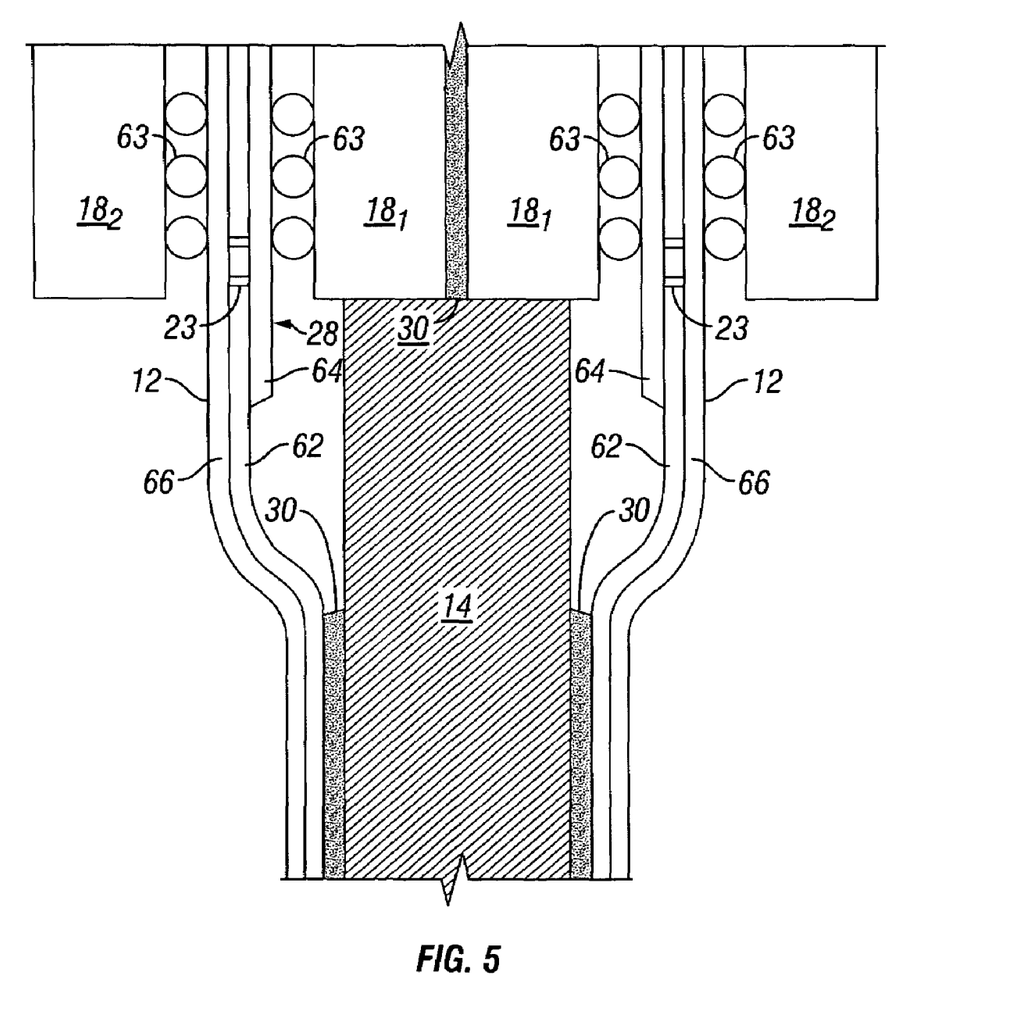
FIG. 5 is an enlarged view of a portion of one preferred embodiment.

FIG. 5 is an enlarged view of a portion of one preferred embodiment showing lower IC $18_1$ and upper IC $18_2$. In this embodiment, conductive layer 66 of flex circuit 12 contains conductive traces connecting module contacts 20 to BGA contacts 63 on ICs $18_1$ and $18_2$. The number of layers may be devised in a manner to achieve the bend radius required in those embodiments that bend flex circuit 12 around edge 16A (FIG. 4) or 16B, for example. The number of layers in any particular portion of flex circuit 12 may also be devised to achieve the necessary connection density given a particular minimum trace width associated with the flex circuit technology used. Some flex circuits 12 may have three or four or more conductive layers. Such layers may be beneficial to route signals for applications such as, for example, a FB-DIMM (fully-buffered DIMM) which may have fewer DIMM input/output signals than a registered DIMM, but may have more interconnect traces required among devices on the DIMM, such as, for example, the C/A copy A and C/A copy B (command/address) signals produced by an FB-DIMM advanced memory buffer (AMB).

In this embodiment, there are three layers of flex circuit 12 between the two depicted ICs $18_1$ and $18_2$. Conductive layers 64 and 66 express conductive traces that connect to the ICs and may further connect to other discrete components (not shown). Preferably, the conductive layers are metal such as, for example, copper or alloy 110. Vias such as the exemplar vias 23 connect the two conductive layers 64 and 66 and thereby enable connection between conductive layer 64 and module contacts 20. In this preferred embodiment having a three-layer portion of flex circuit 12, the two conductive layers 64 and 66 may be devised in a manner so that one of them has substantial area employed as a ground plane. The other layer may employ substantial area as a voltage reference plane. The use of plural conductive layers provides advantages and the creation of a distributed capacitance intended to reduce noise or bounce effects that can, particularly at higher frequencies, degrade signal integrity, as those of skill in the art will recognize. If more than two conductive layers are employed, additional conductive layers may be added with insulating layers separating conductive layers. Portions of flex circuit 12 may in some embodiments be rigid portions (rigid-flex). Construction of rigid-flex circuitry is known in the art.

With the construction of an embodiment such as that shown in FIG. 5, thermal energy will be urged to move between the respective ICs $18_1$. Thus, the ICs become a thermal mass sharing the thermal load. Flex circuit 12 may be particularly devised to operate as a heat spreader or sink adding to the thermal conduction out of ICs $18_1$ and $18_2$.

Figure 6:
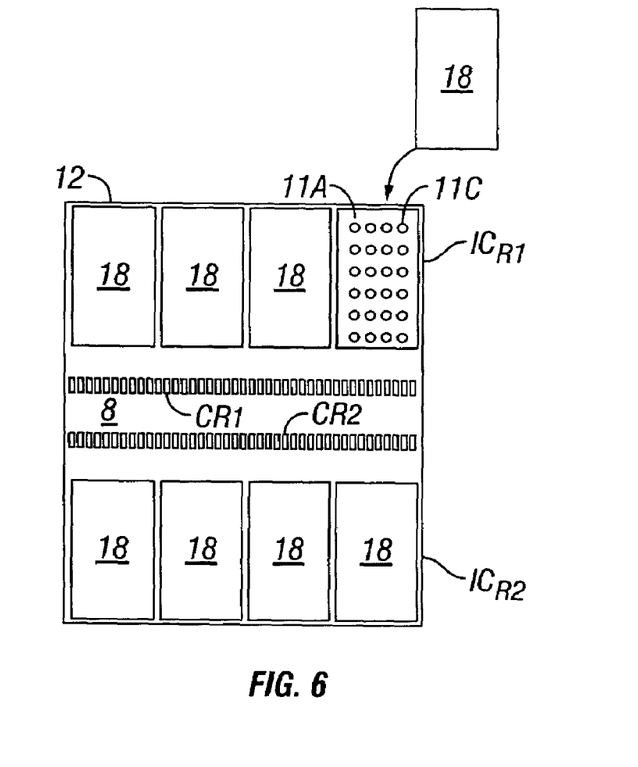
FIG. 6 depicts an exemplar contact-bearing first side of a flex circuit devised in accordance with a preferred embodiment of the present invention.

FIG. 6 depicts an exemplar contact-bearing first side of a flex circuit devised in accordance with a preferred embodiment of the present invention. As those of skill will understand, the depiction of FIG. 6 is simplified to show more clearly the principles of the invention but depicts fewer ICs 18 than would typically be presented on a flex circuit 12 devised for use in embodiments of the present invention. An embodiment with more ICs 18 is shown in FIG. 1. The principles of the present invention may, however, be employed where only one IC 18 is resident on a side of a flex circuit 12 or where multiple rows or sets of ICS are resident on a side of flex circuit 12.

Figure 7:
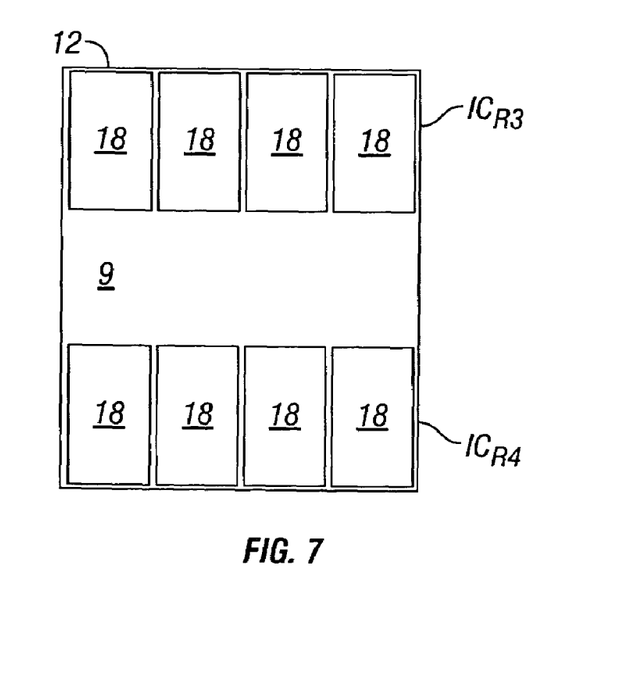
FIG. 7 depicts the second side of the flex circuit of FIG. 6.

FIG. 7 depicts the second side of the flex circuit of FIG. 6. FIG. 7, in the interests of clarity, illustrates the embodiment with fewer ICs 18 than would typically be employed in an actual embodiment of the invention devised in accord with the principles described herein.

Figure 8:
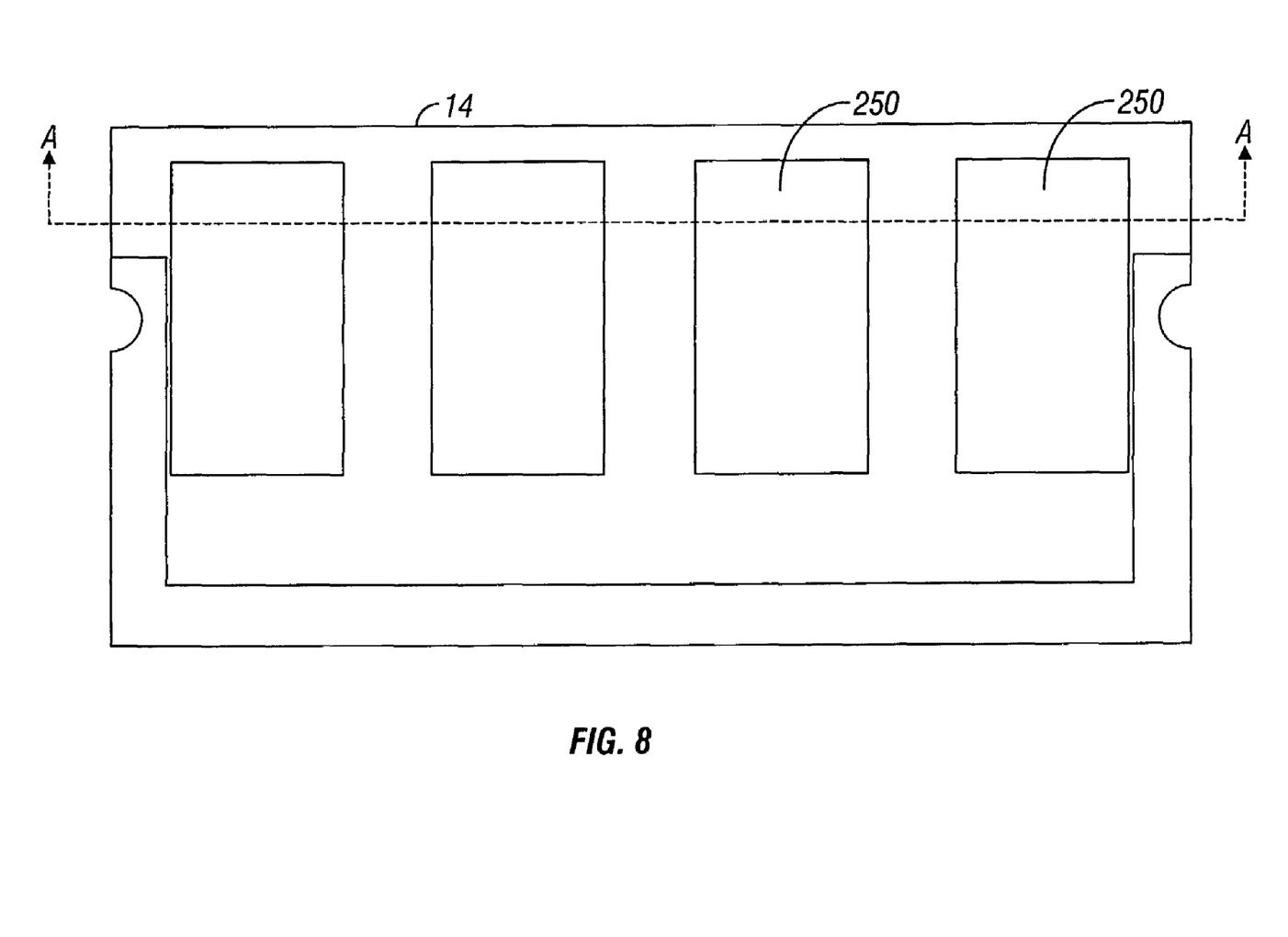
FIG. 8 depicts an exemplar substrate formed to be employed with the exemplar flex circuit depicted in FIGS. 6 and 7.

FIG. 8 depicts an exemplar substrate formed to be employed with the exemplar flex circuit depicted in FIG. 7. The second side 9 of flex circuit 12 shown in FIG. 7 is folded about substrate 14 shown in FIG. 8 to place ICs 18 into the windows 250 arrayed along substrate 14. This results in ICs along rows ICR3 and ICR4 being disposed back to back within windows 250. Preferably, a thermally conductive adhesive or glue is used on the upper sides of ICs 18 to encourage thermal energy flow as well as provide some mechanical advantages. Those of skill will recognize that in this embodiment, where FIG. 6 depicts the first or, in this case, the outer side of the flex circuit once combined with substrate 14, the flex circuit itself will have staggered mounting arrays 11A on side 8 of flex circuit 12 relative to side 9 of flex circuit 12. This is merely one relative arrangement between ICs 18 on respective sides of substrate 14.

Figure 9:
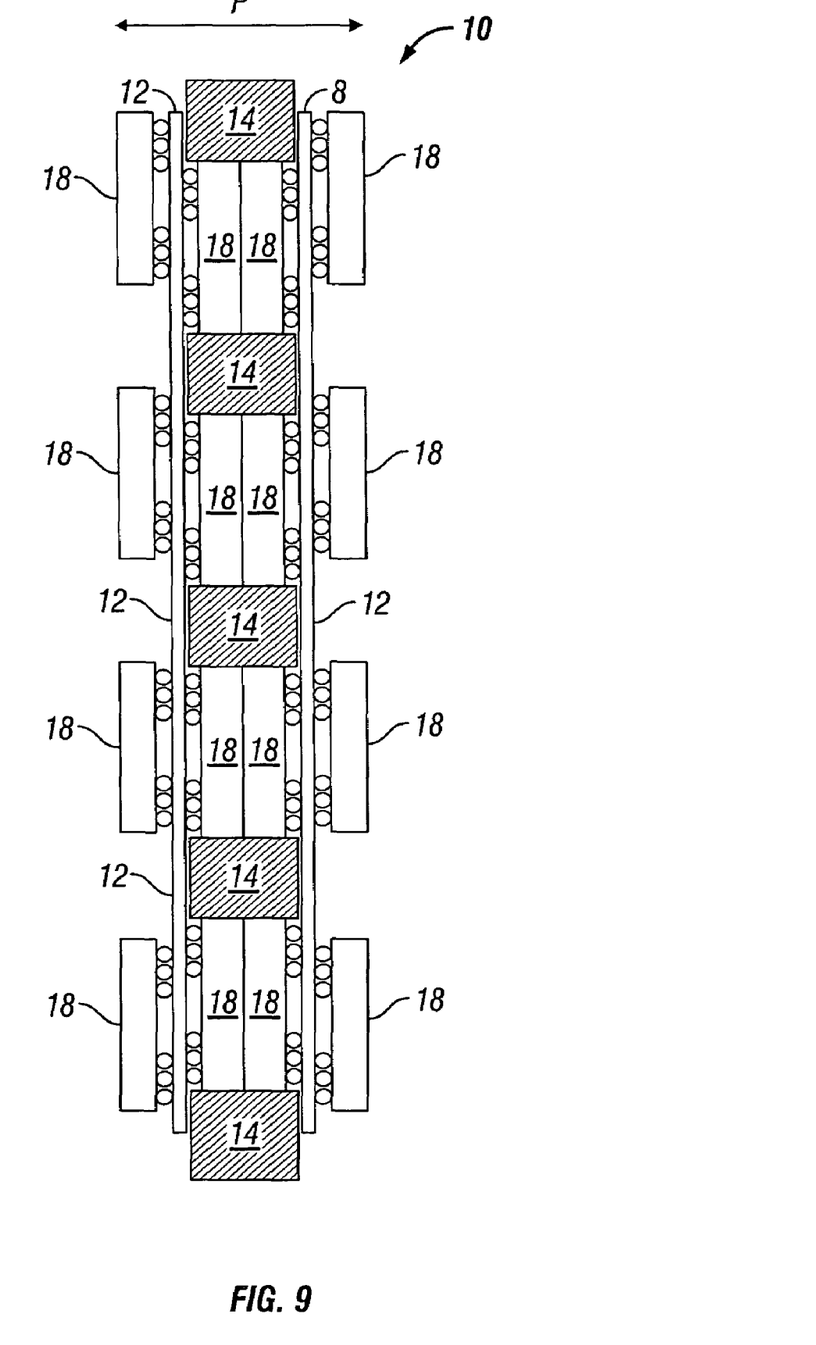
FIG. 9 depicts a view along the line A-A shown in FIG. 8 with flex circuit 12 combined with substrate 14.

FIG. 9 depicts a view along the line A-A shown in FIG. 8 with flex circuit 12 combined with substrate 14. As shown in FIG. 8, ICs 18 which are on second side 9 (which in this depiction is the inner side with respect to the module 10) of populated flex circuit 12 are disposed in windows 250 so that the upper surfaces $18_T$ of ICs 18 of row ICR3 are in close proximity with the upper surfaces $18_T$ of ICs 18 of row ICR4. Thus, these first and second groups of ICs (CSPs in the depiction) are positioned in the cutaway areas of the first and second lateral sides, respectively, of substrate 14. In this case, the cutaway areas on each lateral side of substrate 14 are in spatial coincidence to create windows 250. Those of skill will recognize that the depiction is not to scale but representative of the interrelationships between the elements and the arrangement results in a profile "P" for module 10 that is significantly smaller than it would have been without fitting ICs 18 along inner side 9 of flex circuit 12 into windows 250. Profile P in this case is approximately the sum of the distances between the upper and lower surfaces of IC 18 plus 4× the diameter of the BGA contacts 63 plus 2× the thickness of flex circuit 12 in addition to any adhesive layers 30 employed to adhere one IC 18 to another. This profile dimension will vary depending upon whether BGA contacts 63 are disposed below the surface of flex circuit 12 to reach an appropriate conductive layer or contacts which typically are a part of flex circuit 12.

Figure 10:
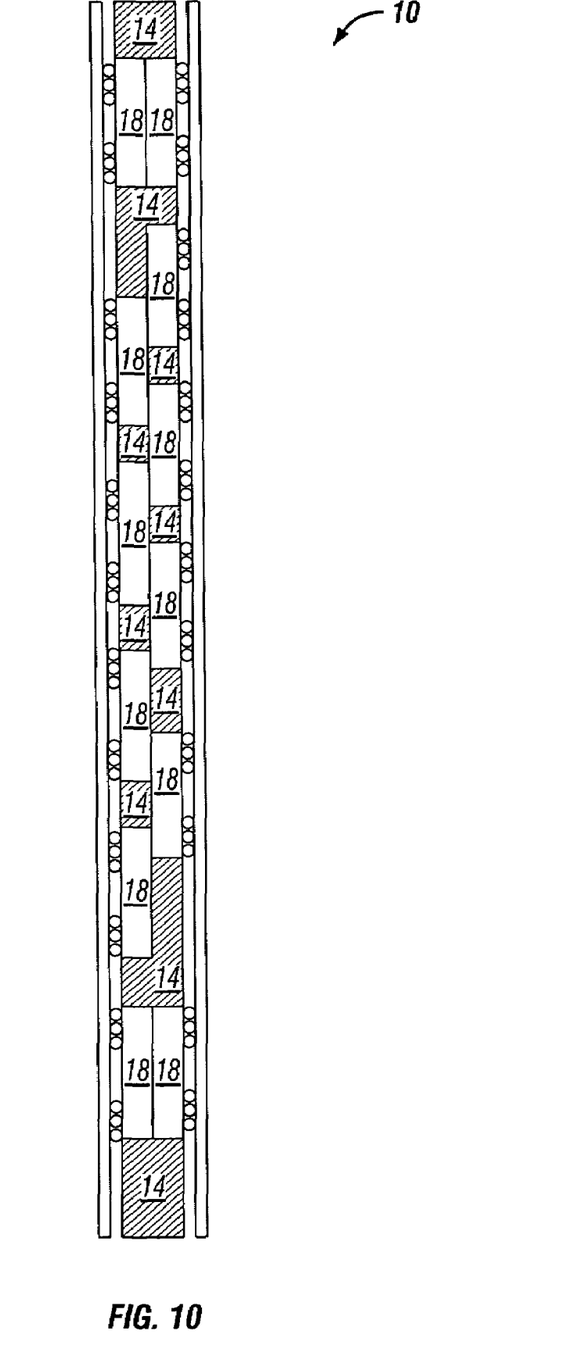
FIG. 10 is another depiction of a relationship between flex circuit 12, and a substrate 14 which has been patterned or window in accordance with a preferred embodiment.

FIG. 10 is another depiction of the relationship between flex circuit 12, and a substrate 14 which has been patterned or windowed with cutaway areas. The view of FIG. 10 is taken along a line that would intersect the bodies of ICs 18. In FIG. 10, as those of skill will recognize, ICs 18 that comprise row or group ICR3 are staggered relative to those that comprise row or group ICR4 of second side 9 of flex circuit 12 when module 10 is assembled and flex circuit 12 is combined with substrate 14. This staggering may result in some construction benefits providing a mechanical "step" for ICs 18 as they are fitted into substrate 14 and may further provide some thermal advantages increasing the contact area between substrate 14 and the plurality of ICs 18.

Figure 11:
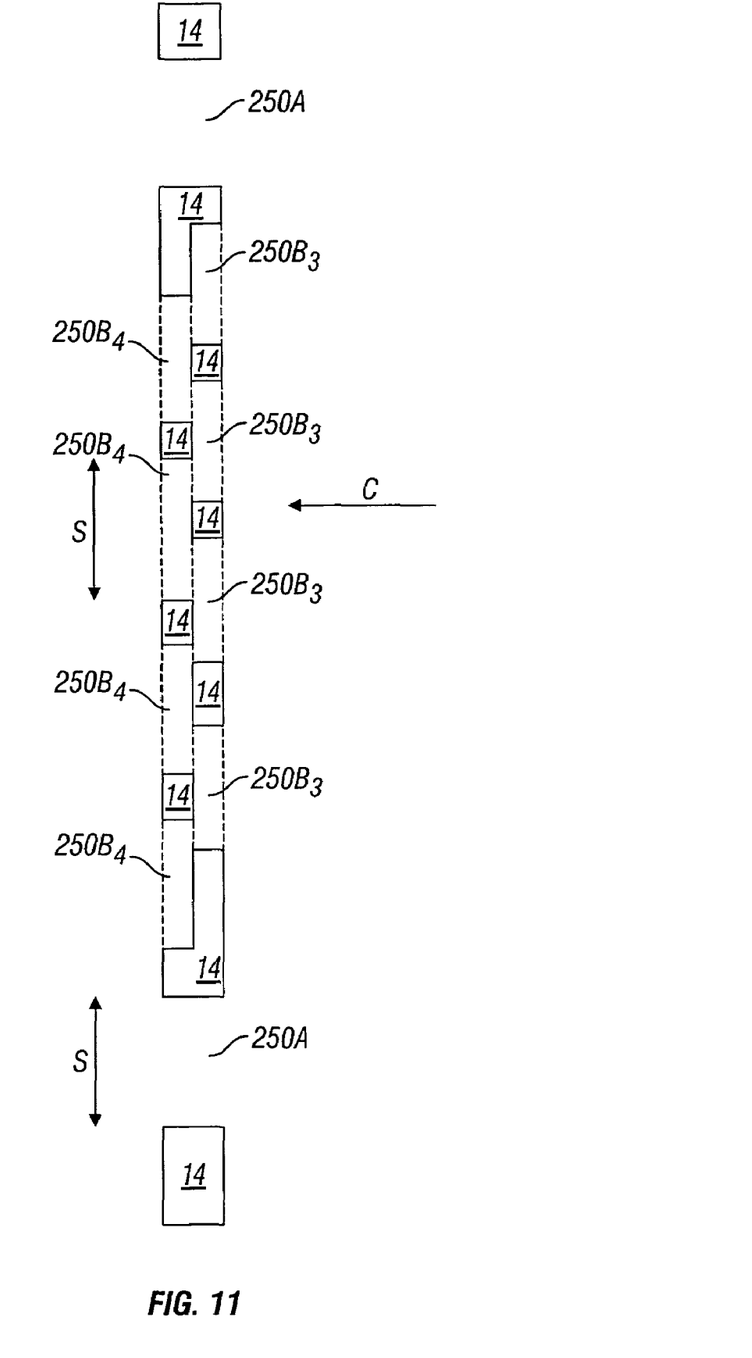
FIG. 11 depicts exemplar substrate 14 employed in FIG. 10 before being combined with populated flex circuit 12 as viewed along a line through windows 250 of substrate 14.

FIG. 11 depicts exemplar substrate 14 employed in FIG. 10 before being combined with populated flex circuit 12 as viewed along a line through windows 250 of substrate 14. As depicted in FIG. 11, a number of cutaway areas or pockets are delineated with dotted lines and identified with references 250B3 and 250B4, respectively. Those areas identified as 250B3 correspond, in this example, to the pockets, sites, or cutaway areas on one side of substrate 14 into which ICs 18 from ICR3 of flex circuit 12 will be disposed when substrate 14 and flex circuit 12 are combined. Those pocket, sites, or cutaway areas identified as references 250B4 correspond to the sites into which ICs 18 from ICR4 will be disposed. In alternate embodiments, there may be more than one row of ICs 18 disposed on a single side of substrate 14.

For purposes herein, the term window may refer to an opening all the way through substrate 14 across span "S" which corresponds to the width or height dimension of packaged IC 18, or it may also refer to that opening where cutaway areas on each of the two sides of substrate 14 overlap.

Figure 12:
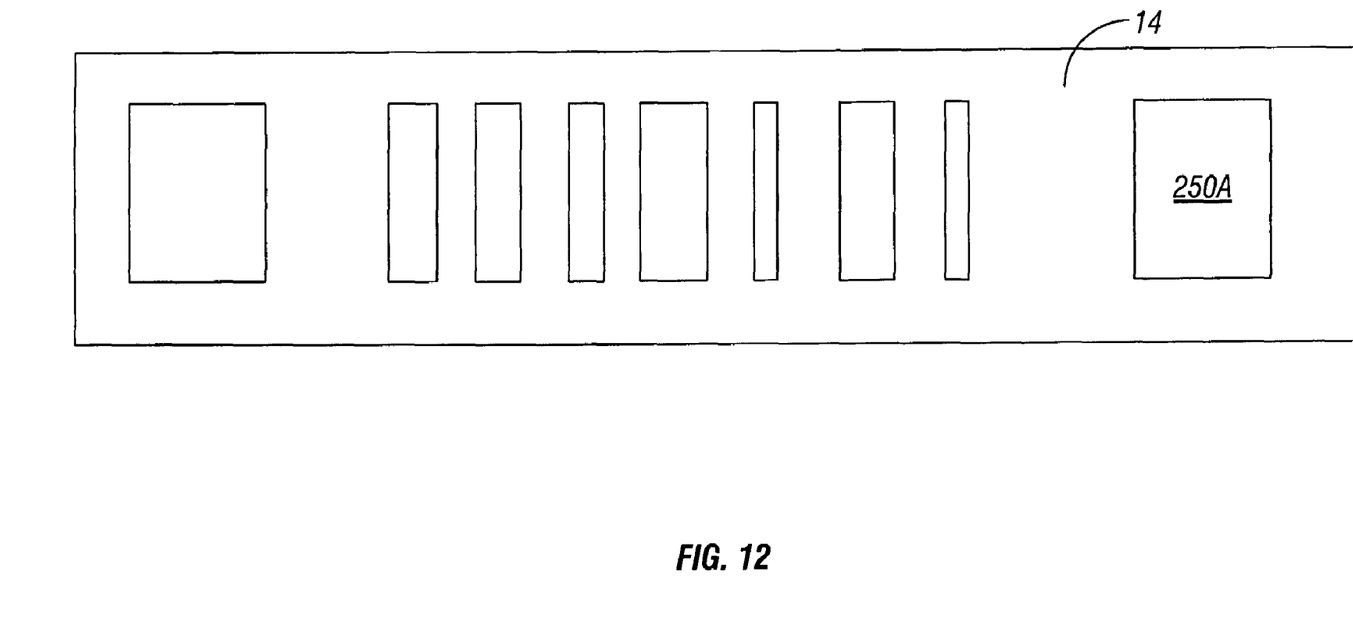
FIG. 12 depicts from another perspective the substrate depicted in FIG. 11.

FIG. 12 depicts the substrate 14 previously depicted in FIG. 11 along the line represented by C. Where cutaway areas 250B3 and 250B4 overlap, there are, as depicted, windows all the way through substrate 14. In some embodiments, cutaway areas 250B3 and 250B4 may not overlap or in other embodiments, there may be pockets or cutaway areas only on one side of substrate 14. Those of skill will recognize that cutaway areas such as those identified with references 250B3 and 250B4 may be formed in a variety of ways depending on the material of substrate 14 and need not literally be "cut" away but may be formed by a variety of molding, milling and cutting processes as is understood by those in the field.

Figure 13:
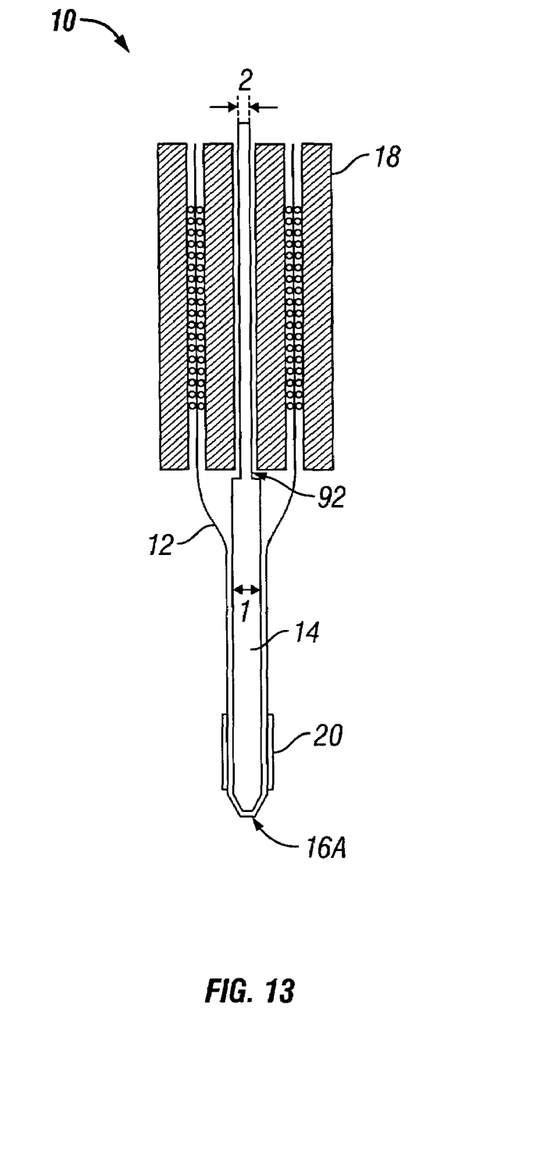
FIG. 13 depicts another embodiment having thinned portions of the substrate.

FIG. 13 depicts another module having a thinned portion of substrate 14. In this embodiment, substrate 14 has a first thickness 1 toward edge 16A devised to provide support for an edge and surrounding area of module assembly 10 as may be needed for connection to a card edge connector. Above the portion of substrate 14 with thickness 1 is a portion 92 having thickness 2.

Figure 14:
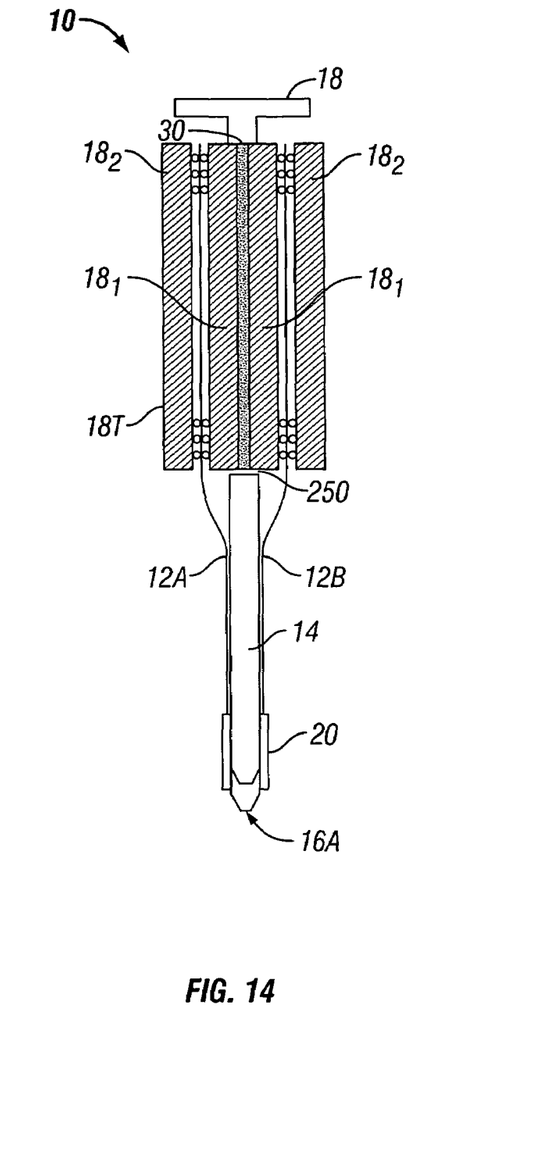
FIG. 14 depicts yet another embodiment of the present invention.

FIG. 14 depicts another embodiment of the present invention. Depicted extension 112 of substrate 14 extends beyond the top of flex 12 and is shaped to provide additional surface area for convective cooling. Such shape may be achieved by methods such as, for example, milling or extrusion, which are both known in the art. Preferably, extruded aluminum is used for substrate 14 in this and similar embodiments. The embodiment depicted in FIG. 14 employs two flex circuits 12A and 12B thus presenting an embodiment in which the flex circuit does not wrap about end 16A of substrate 14. The innermost ICs 18 are shown disposed in windows with their respective upper surfaces $18_T$ connected with an adhesive 30 which is preferably thermally conductive.

Figure 15:
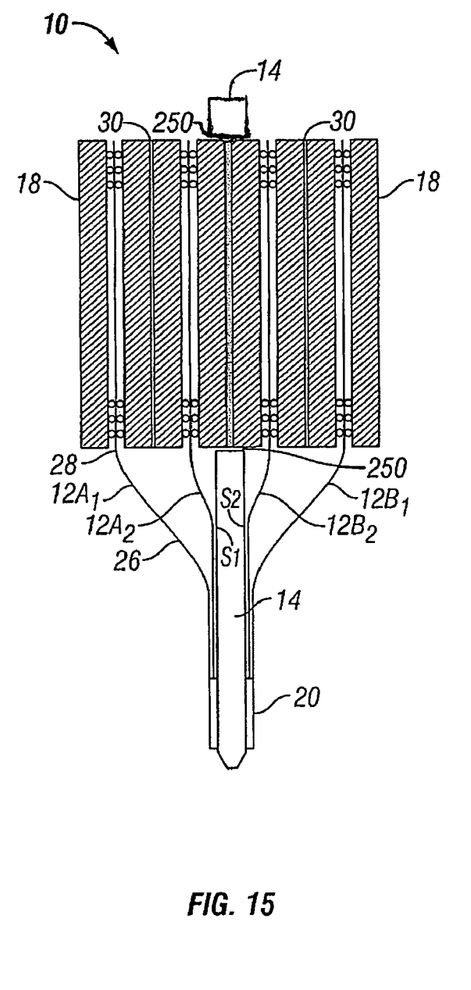
FIG. 15 depicts another embodiment of the invention having additional ICs.

FIG. 15 depicts another embodiment of the invention having additional ICs 18. In this embodiment, four flex level transitions 26 connect to four mounting portions 28 of flex circuits $12A_1$, $12A_2$, $12B_1$, and $12B_2$. Each mounting portion 28 has ICs 18 on both sides. Flex circuitry 12 may also be provided in this configuration by, for example, having a split flex with layers interconnected with vias. As depicted, module 10 of FIG. 15 exhibits eight (8) ICs 18 coincident with a single window site 250 in substrate 14. Consequently, as those of skill will recognize, the possibilities for large capacity iterations of module 10 are magnified by such strategies and the same principles may be employed where the ICs 18 on one side of substrate 14 are staggered relative to those ICs 18 on the other side of substrate 14.

Four flex circuits are employed in module 10 as depicted in FIG. 15 and, although those embodiments that wrap flex circuit 12 about end 16A of substrate 14 present manufacturing efficiencies, in some environments having flex circuitry separate from each other on respective sides $S_1$ and $S_2$ of substrate 14 may be desirable.

Figure 16:
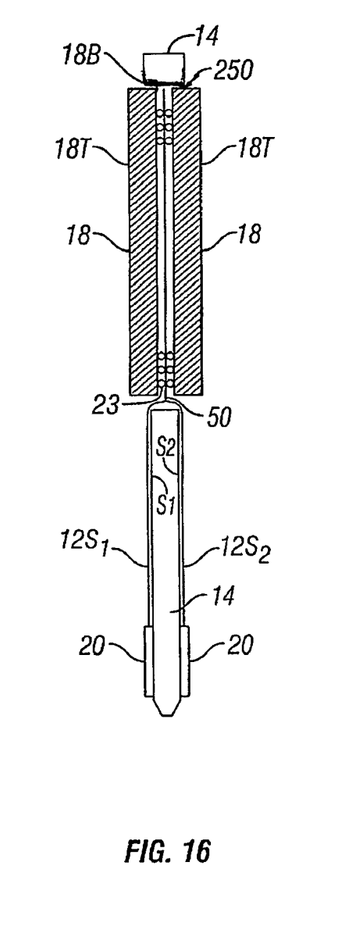
FIG. 16 depicts yet another embodiment of the present invention.

FIG. 16 depicts another embodiment in which flex circuit 12 connects ICs 18 fitted on respective sides into windows 250 and connected face to face with BGA contacts 63 facing each other on opposite sides of flex circuit 12 which is split at juncture 50 into flex circuits $12S_1$ and $12S_2$ that convey signals from ICs 18 to module contacts 20.

One advantageous methodology for efficiently assembling a circuit module 10 such as described and depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14 as ICs 18 are fitted into respective cutout areas of substrate 14. Tooling holes 17 may be used to align flex 12 to substrate 14. Flex 12 may be laminated or otherwise attached to substrate 14.

Although the present invention has been described in detail, it will be apparent to those skilled in the art that many embodiments taking a variety of specific forms and reflecting changes, substitutions and alterations can be made without departing from the spirit and scope of the invention. The described embodiments illustrate but do not restrict the scope of the claims.

The invention claimed is:

1. A circuit module comprising:
    a flex circuit having a first side and a second side and two rows of plural contacts which are adapted for connection to an edge connector and disposed along the first side of the flex circuit;
    a first plurality of CSPs mounted along the second side of the flex circuit;
    a rigid substrate having first and second opposing lateral sides and a bottom edge, the rigid substrate having at least one window passing therethrough, and within which at least one window is at least partially disposed at least one CSP of the first plurality of CSPs mounted along the second side of the flex circuit, the flex circuit being disposed about the bottom edge of the rigid substrate to position the two rows of plural contacts proximal to said bottom edge with each of the two rows of plural contacts being disposed so as to be supported by the first and second opposing lateral sides of the rigid substrate, respectively.

2. The circuit module of claim 1 further comprising a first outer plurality of CSPs, the first outer plurality of CSPs being mounted along the first side of the flex circuit.

3. The circuit module of claim 2 further comprising a second outer plurality of CSPs, the second outer plurality of CSPs being mounted along the first side of the flex circuit.

4. The circuit module of claim 1 in which the upper surfaces of respective CSPs which comprise the first plurality of CSPs are adhered together.

5. A circuit module comprising:

a flex circuit having edge connector contacts adapted for connection to an edge connector socket, the flex circuit further having a first side and a second side along which second side are mounted a first group and a second group of CSPs;

a rigid substrate having a first lateral side and a second lateral side and a bottom edge, the rigid substrate having one or more windows that pass through the rigid substrate, the flex circuit being disposed about the bottom edge of the rigid substrate to position individual ones of the first group of CSPs into the one or more windows of the rigid substrate from the first lateral side of the rigid substrate and position individual ones of the second group of CSPs into the one or more windows of the rigid substrate from the second lateral side of the rigid substrate so as to contact the individual ones of the first group of CSPs positioned into the one or more windows of the rigid substrate from the first lateral side of the rigid substrate.

6. A circuit module comprising:

(a) a flex circuit having an inner side and an outer side;

(b) plural CSPs mounted along the inner side and the outer side of the flex circuit;

(c) a bend in the flex circuit between first and second portions of the flex circuit, the flex circuit having first and second rows of edge connector contacts disposed on the outer side of the flex circuit with the first row of edge connector contacts being disposed on the first portion of the flex circuit and the second row of edge connector contacts being disposed on the second portion of the flex circuit; and (d) a rigid substrate having a first lateral side and a second lateral side and a bottom edge about which the flex circuit transits through the bend to dispose the first and second rows of edge connector contacts proximal to the bottom edge of the rigid substrate with the first row of edge connector contacts being supported by the first lateral side of the rigid substrate and the second row of edge connector contacts being supported by the second lateral side of the rigid substrate, the rigid substrate having a first part and a second part, the first part being thinner than the second part, the first part having at least one window passing therethrough, through which at least one window passes at least one of the plural CSPs mounted along the inner side of the flex circuit that transits about the bottom edge of the rigid substrate.

7. A circuit module comprising:

a rigid substrate having two opposing lateral sides and a bottom edge and a plurality of windows that pass through the rigid substrate and dimensioned to accept individual CSPs;

a flex circuit wrapped around the bottom edge of the rigid substrate, the flex circuit having an inner side and an outer side, the inner and outer sides each having contact sites for mounting CSPs, the flex circuit having plural edge connector contacts adapted for electrical connection of the circuit module to an edge connector;

a plurality of CSPs, each of which is mounted to one of the contact sites of the inner side of the flex circuit, at least some of which are disposed through individual ones of the plurality of windows through the rigid substrate.

* * * * *